United States Patent
Hoffman et al.

(10) Patent No.: US 8,070,925 B2
(45) Date of Patent: Dec. 6, 2011

(54) PHYSICAL VAPOR DEPOSITION REACTOR WITH CIRCULARLY SYMMETRIC RF FEED AND DC FEED TO THE SPUTTER TARGET

(75) Inventors: Daniel J. Hoffman, Saratoga, CA (US); Ying Rui, Santa Clara, CA (US); Karl M. Brown, Mountain View, CA (US); John Pipitone, Livermore, CA (US); Lara Hawrylchak, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 572 days.

(21) Appl. No.: 12/253,603

(22) Filed: Oct. 17, 2008

(65) Prior Publication Data

US 2010/0096261 A1 Apr. 22, 2010

(51) Int. Cl.
C23C 14/35 (2006.01)

(52) U.S. Cl. .............................. 204/298.08; 204/298.16

(58) Field of Classification Search ............... 208/298.2, 208/298.08, 298.11
See application file for complete search history.

(56) References Cited

U.S. PATENT DOCUMENTS

| | | | |
|---|---|---|---|
| 5,482,610 A * | 1/1996 | Wolf et al. .............. | 204/298.19 |
| 6,692,618 B2 * | 2/2004 | Dubs ....................... | 204/192.12 |
| 2001/0052455 A1 * | 12/2001 | Hong ....................... | 204/192.12 |
| 2002/0162737 A1 | 11/2002 | Durs ........................ | 204/192.12 |
| 2006/0169582 A1 * | 8/2006 | Brown et al. ............. | 204/298.01 |
| 2008/0023318 A1 | 1/2008 | Kuroiwa ................... | 204/192.1 |
| 2008/0121516 A1 | 5/2008 | Sarkar et al. ............. | 204/192.12 |
| 2010/0032289 A1 * | 2/2010 | Wang et al. .............. | 204/192.12 |

* cited by examiner

*Primary Examiner* — Keith Hendricks
*Assistant Examiner* — Jenny Wu
(74) *Attorney, Agent, or Firm* — Robert M. Wallace

(57) ABSTRACT

In a PVD reactor having a sputter target at the ceiling, a conductive housing enclosing the rotating magnet assembly has a central port for the rotating magnet axle. A conductive hollow cylinder of the housing surrounds an external portion of the spindle. RF power is coupled to a radial RF connection rod extending radially from the hollow cylinder. DC power is coupled to another radial DC connection rod extending radially from the hollow cylinder.

18 Claims, 6 Drawing Sheets

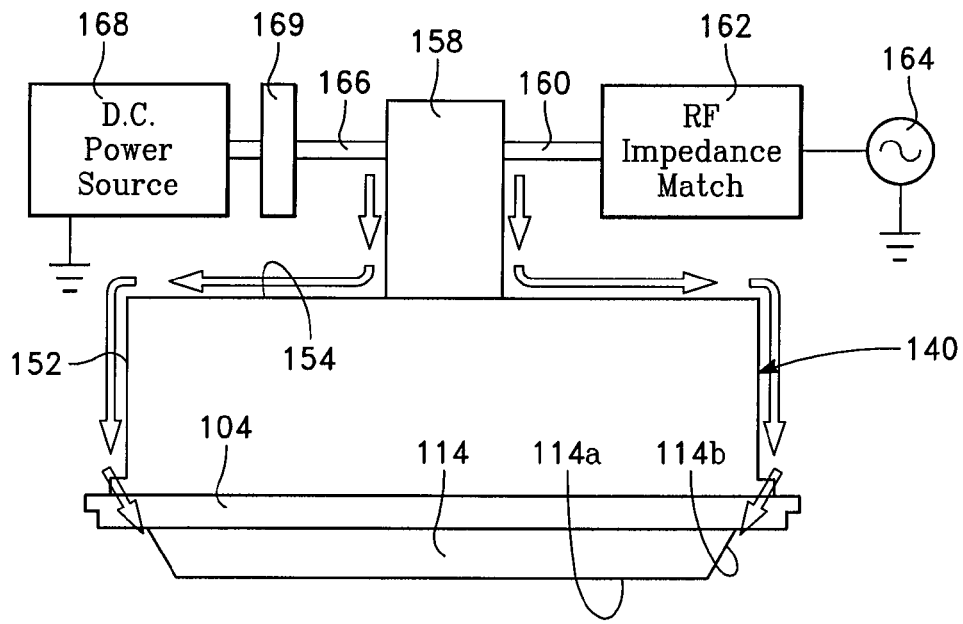
FIG. 5
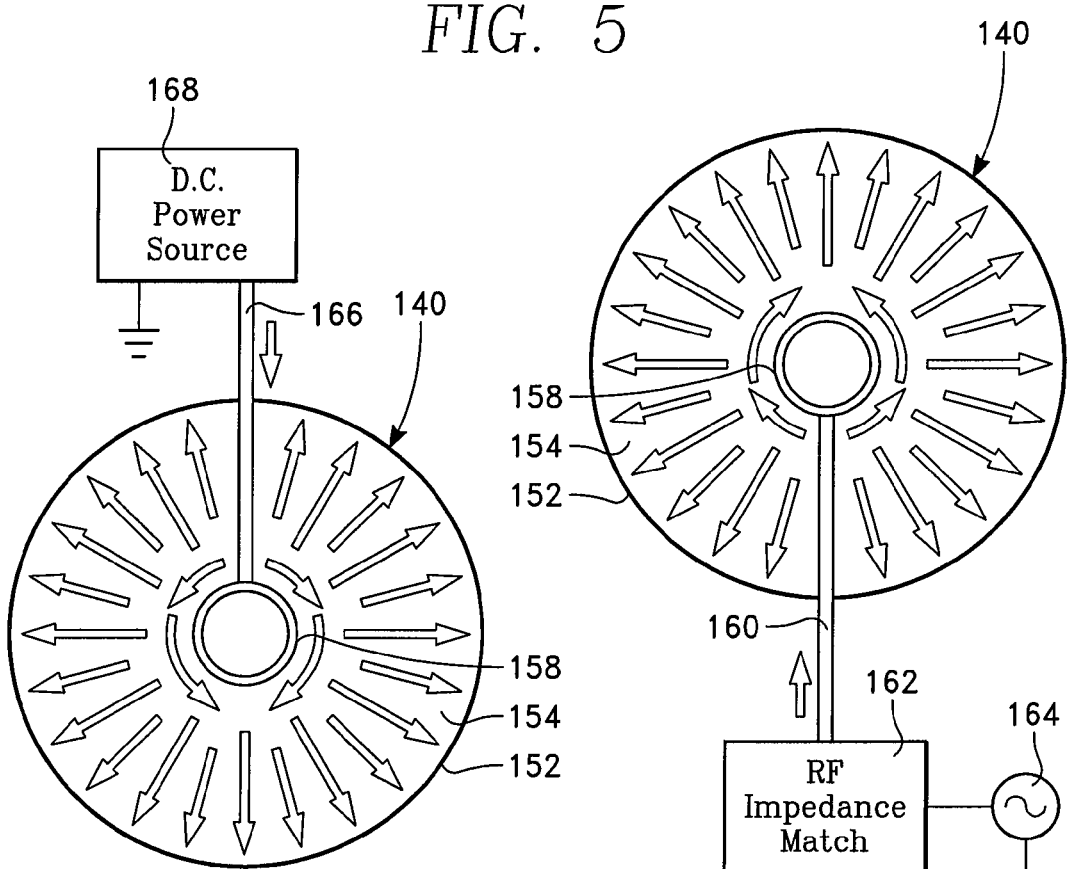
FIG. 6
FIG. 7

PHYSICAL VAPOR DEPOSITION REACTOR WITH CIRCULARLY SYMMETRIC RF FEED AND DC FEED TO THE SPUTTER TARGET

BACKGROUND

Plasma enhanced physical vapor deposition (PECVD) processes are used to deposit metal films such as copper onto semiconductor wafers to form electrical interconnections. A high level of D.C. power is applied to a copper target overlying the wafer in the presence of a carrier gas, such as argon. PECVD processes typically rely upon a very narrow angular distribution of ion velocity to deposit metal onto sidewalls and floors of high aspect ratio openings. One problem is how to deposit sufficient material on the sidewalls relative to the amount deposited on the floors of the openings. Another problem is avoiding pinch-off of the opening due to faster deposition near the top edge of the opening. As miniaturization of feature sizes has progressed, the aspect ratio (depth/width) of a typical opening has increased, with microelectronic feature sizes having now been reduced to about 22 nanometers. With greater miniaturization, it has become more difficult to achieve minimum deposition thickness on the sidewall for a given deposition thickness on the floor or bottom of each opening. The increased aspect ratio of the typical opening has been addressed by further narrowing of the ion velocity angular distribution, by increasing the wafer-to-sputter target distance (e.g., to 300 mm or more) and reducing the chamber pressure (e.g., to less than 1 mT). This has given rise to a problem observed in thin film features near the edge of the wafer: At extremely small feature sizes, a portion of each high aspect ratio opening sidewall is shadowed from a major portion of the target because of the greater wafer-to-target gap required to meet the decreasing feature size. This shadowing effect, most pronounced near the wafer edge, makes it difficult if not impossible to reach a minimum deposition thickness on the shadowed portion of the side wall. With further miniaturization, it has seemed a further decrease and chamber pressure (e.g., below 1 mT) and a further increase in wafer-sputter target gap would be required, which would exacerbate the foregoing problems.

A related problem is that the sputter target (e.g., copper) must be driven at a high level of D.C. power (e.g., in the range of kiloWatts) to ensure an adequate flow of ions to the wafer across the large wafer-to-target gap. Such a high level of D.C. power rapidly consumes the target (driving up costs) and produces an extremely high deposition rate so that the entire process is completed in less than five seconds. Such a fast process is difficult to control, in that little or no adjustment is possible. Moreover, the short process duration is about 40% of the time required for the RF source power impedance match to equilibrate following plasma ignition, so that about 40% of the process is performed prior to stabilization of the impedance match and delivered power.

SUMMARY

An RF feed system for a sputter target of a plasma reactor is provided. The system includes a conductive housing overlying the ceiling and having a top lid facing the ceiling. A rotating magnet assembly is contained within the housing and includes a rotatable spindle, a radial arm assembly coupled at an inner end to the spindle, and a magnet coupled to an outer end of the radial arm assembly. The top lid of the housing has a central port, the spindle extending axially through the central port. A conductive hollow cylinder on the top lid surrounds a portion of the spindle that extends above the top lid. A radial RF connection rod extends radially from the hollow cylinder. The RF connection rod is connected to an impedance match of an RF power source. A radial DC connection rod extends radially from the hollow cylinder. A DC power source is connected to the DC connection rod. The RF connection rod and the DC connection rod emanate from locations on the hollow cylinder that are angularly offset from one another, by about 180° in one embodiment. The connection rods, the hollow cylinder, the top lid, the housing and the ceiling are conductive and provide an electrical path to the sputter target.

BRIEF DESCRIPTION OF THE DRAWINGS

So that the manner in which the exemplary embodiments of the present invention are attained and can be understood in detail, a more particular description of the invention, briefly summarized above, may be had by reference to the embodiments thereof which are illustrated in the appended drawings. It is to be appreciated that certain well known processes are not discussed herein in order to not obscure the invention.

FIG. 5 is a simplified diagram depicting RF and DC current flow to the sputter target in the reactor of FIG. 1.

FIG. 6 is a plan view corresponding to FIG. 5 depicting DC current flow to the target.

FIG. 7 is a plan view corresponding to FIG. 5 depicting RF current flow to the target.

Figure 1:
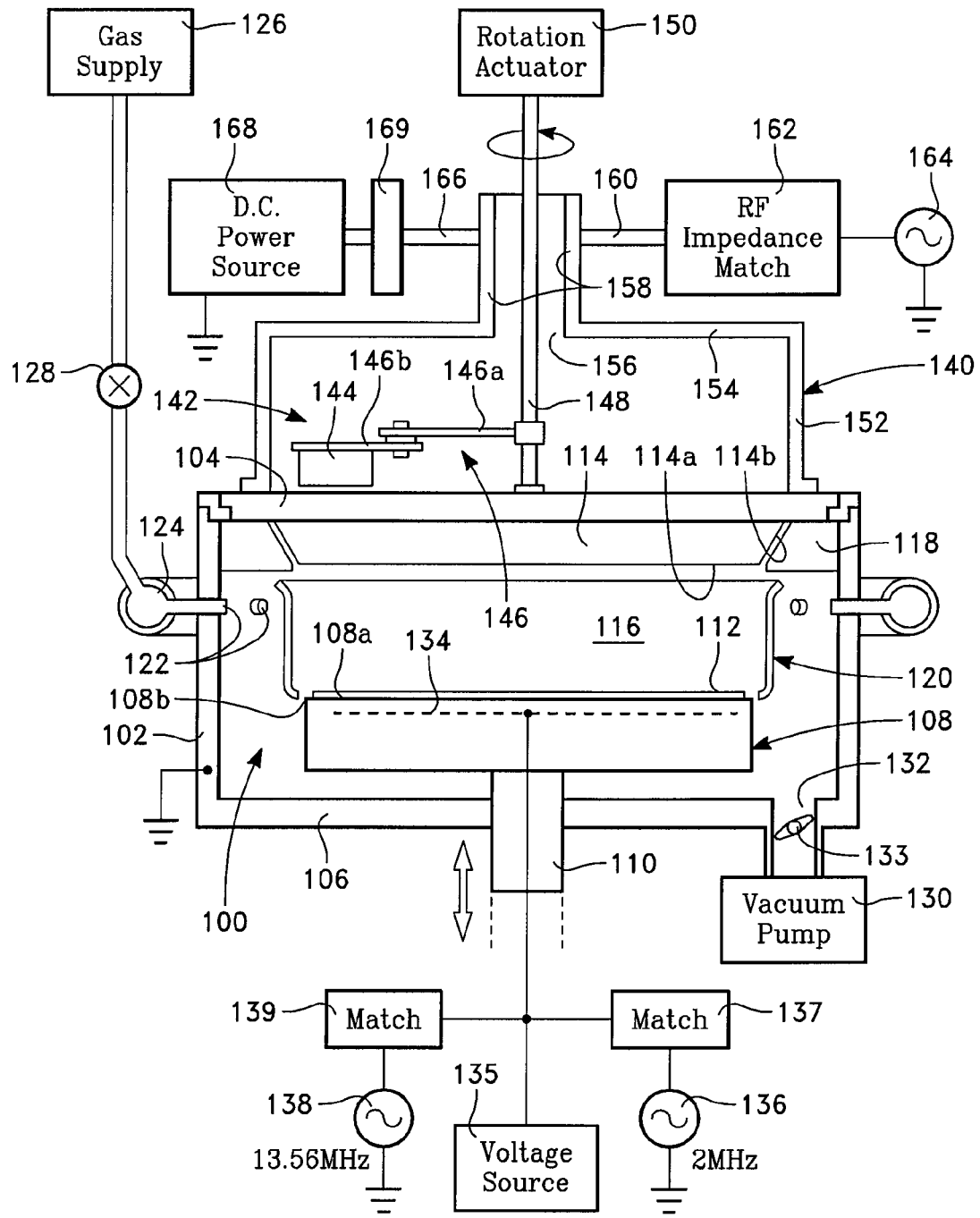
FIG. 1 is a simplified elevational view of a plasma reactor in accordance with one embodiment.

To facilitate understanding, identical reference numerals have been used, where possible, to designate identical elements that are common to the figures. It is contemplated that elements and features of one embodiment may be beneficially incorporated in other embodiments without further recitation. It is to be noted, however, that the appended drawings illustrate only exemplary embodiments of this invention and are therefore not to be considered limiting of its scope, for the invention may admit to other equally effective embodiments.

DETAILED DESCRIPTION

We have recently solved the foregoing problems related to shadowing of thin film features on the wafer. Our solution includes, among other things, providing an extremely narrow wafer-to-target gap (e.g., about one-sixth of the wafer diameter), using a very high chamber pressure (e.g., 100 mT, or one at which the ion collision mean free path is about ¹⁄₂₀ of the gap), and enhancing plasma density at the wafer surface by applying VHF source power to the target and providing a low impedance VHF ground return path through the wafer. This solution is the subject matter of co-pending U.S. application Ser. No. 12/077,067, filed Mar. 14, 2008, entitled PHYSICAL VAPOR DEPOSITION METHOD WITH A SOURCE OF ISOTROPIC ION VELOCITY DISTRIBUTION AT THE WAFER SURFACE by Daniel Hoffman et al. and assigned to the present assignee, the disclosure of which is incorporated herein by reference in its entirety.

In carrying out this solution, we have found that the reduced wafer-target gap renders the process vulnerable to asymmetries in the distribution of RF power to the target. In particular, the RF power must be applied to an overhead structure (e.g., the ceiling) above the sputter target at an off-axis connection because the center axis is occupied by the magnetron rotation apparatus. Each time the rotating magnet of the magnetron assembly passes under the off-axis RF power connection, RF coupling to the plasma is briefly enhanced, while plasma conditions (e.g., plasma load impedance presented to the VHF power) are changed. D.C. power, which may be connected at another off-axis location above the target, is affected by these changes. These fluctuations occur with each rotation of the magnet past the off-axis RF power connection. While such fluctuations have not been a problem in conventional reactors having large wafer-to-target gaps (e.g., 300 mm), we seek to operate with a very small wafer-target gap (e.g., 5 cm—as discussed above) at which such fluctuations are closely coupled to the wafer.

One symptom of the foregoing problem is an azimuthal pattern of non-uniform deposition on the wafer surface that reflects the off-axis locations of the RF power and DC power connections over the target. In one example, the deviation between minimum and maximum deposition film thickness in the azimuthal direction was 26%. Another symptom is plasma instability or fluctuations in plasma impedance that the VHF impedance match cannot follow at higher chamber pressures, leading to a loss of process control and in some cases automatic shut-down of the VHF generator. Another symptom is penetration of the plasma beneath the wafer support pedestal and damage to unprotected components there, leading to contamination. The impedance fluctuations reduce the range of usable chamber pressures below the desired pressure. A related problem is that if the DC power level is reduced, in accordance with one aspect of our solution referred to above, the fluctuations in plasma conditions caused by passage of the magnet beneath the RF connection over the target (e.g., sudden reductions in voltage) cause automatic anti-arcing features in the DC power supply to shut down the DC power supply. A similar effect can occur with the VHF generator, so that either or both the DC power and the RF power may flicker with each rotation of the magnet. These problems have made it difficult to perform a workable process at the high chamber pressures (e.g., 100 mT) employed in our method.

The problems arising from the small wafer-target gap are solved by providing circularly symmetric distribution of both VHF power and DC power over the target. A non-magnetic metallic housing covers the space within which the magnet circulates above the chamber ceiling. The magnet rotation drive shaft extends through a central passage in the ceiling of this conductive housing. A conductive hollow cylinder surrounding the shaft extends upwardly from the conductive housing ceiling coaxially with the magnet rotation drive shaft. The VHF impedance match (for the VHF generator) has its output coupled to the side of the hollow cylinder. The DC power supply is also coupled to the side of the hollow cylinder cup. The DC and RF connections may be offset around the conductive hollow cylinder by about 180°. Currents from the VHF impedance match and from the DC power supply circulate symmetrically around the hollow cylinder and reach down to the ceiling of the metallic housing in a circularly symmetric distribution, from where they are coupled in a circularly symmetric manner to the chamber ceiling and sputter target. These current distributions are substantially unaffected by the position or rotation the magnet inside the metallic housing. This is because the circularly symmetric RF and DC current distributions do not fluctuate with rotations of the magnet. The result is the elimination of the plasma fluctuations referred to above. Without such fluctuations, the limitations on chamber pressure are overcome, permitting the use of the high chamber pressures we desire (e.g., 100 mT) without flickering or other instabilities. Moreover, there is little or no azimuthal pattern of non-uniformity in deposition thickness attributable to off-axis location of the RF or DC power connections above the sputter target, despite the greatly reduced wafer-target gap (e.g., 55 mm for a 300 mm wafer). In one working example, the deviation between minimum and maximum film thickness in the azimuthal direction was only 0.7% (compared with 27% obtained with a conventional asymmetrical RF feed). Moreover, plasma penetration into the chamber region beneath the wafer is prevented because the plasma fluctuations due to magnet rotation have been eliminated.

The conductive hollow cylinder and the conductive housing surrounding the magnet circulation space are both conductors of the VHF source power applied to the target. RF shielding is provided by an outer conductive shield surrounding the conductive housing. The shield is grounded and is separated from the housing by an insulating space, which may be air or (alternatively) may be filled with an insulating material such as plastic. If the insulating space is mainly filled with air, then the separation may be maintained by placing small plastic spacers at periodic intervals along the space. Power loss due to parasitic capacitance is minimized by providing a material in the insulating space having a low dielectric constant (such as air). Parasitic capacitance is further minimized by providing a large separation distance between the shield and the housing. In one embodiment, the parasitic capacitance presented by the shield was about 14 picofarads, presenting an impedance to ground of about 0.2Ω at 60 MHz.

In order to avoid arcing or breakdown of the insulating material, the separation distance is sufficiently large so that the electric field across the insulating space attributable to the voltage on the ceiling does not exceed the electrical breakdown threshold of the insulating material. If the housing-shield separation space is filled with air, then the separation distance is sufficiently great to limit the electric field to 30,000 volts/cm (the breakdown threshold of air). The voltage on the ceiling may, in one example, be about 1100 volts, attributable to about 500 volts VHF from the RF source, about 500 volts DC from the DC source and about 100 volts RF from a bias voltage applied to the wafer and returned through the ceiling. In this example, the separation distance would need to be at least about 0.3 mm.

Figure 2:
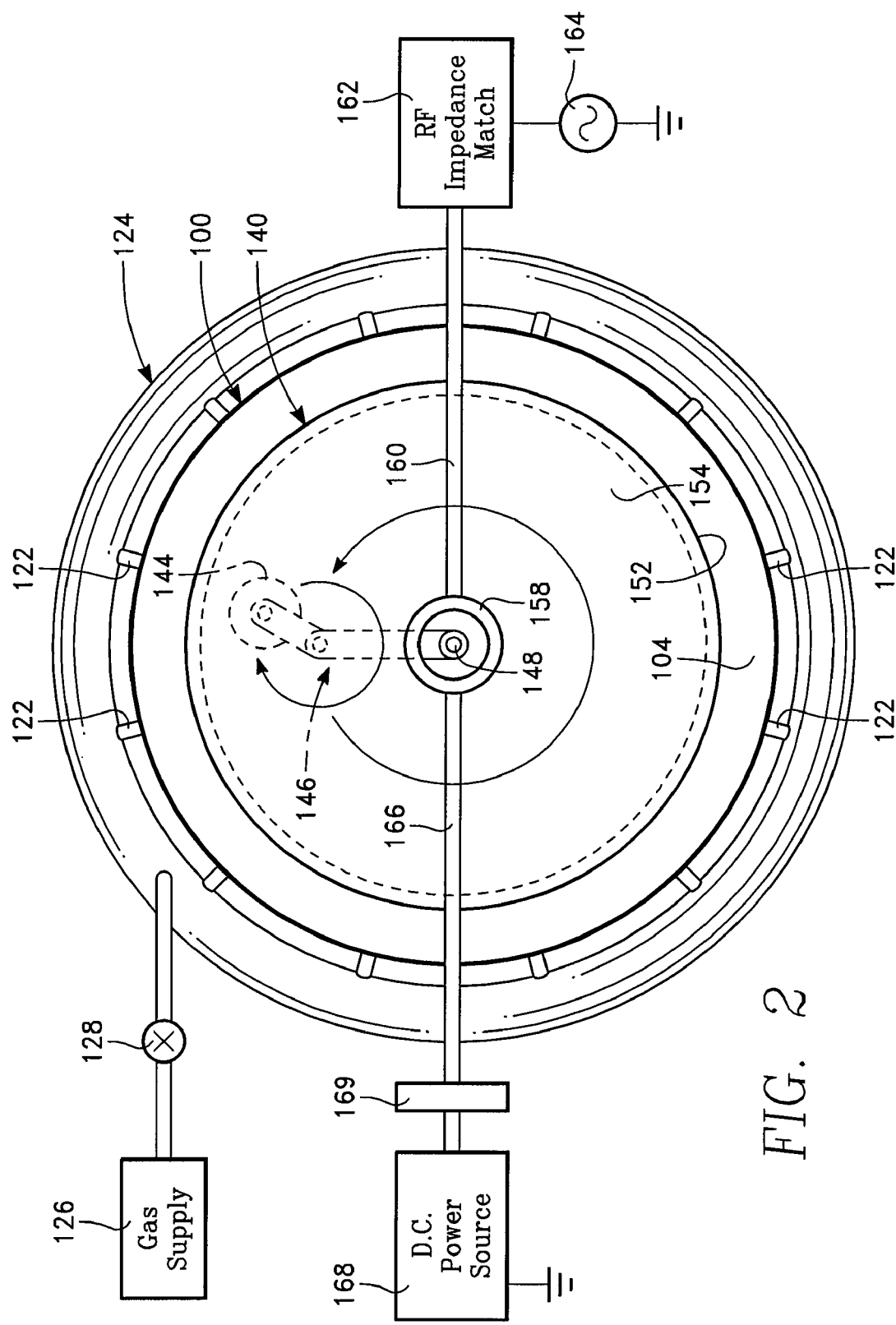
FIG. 2 is a plan view corresponding to FIG. 1.

FIGS. 1 and 2 illustrate a plasma reactor for carrying out plasma-enhanced physical vapor deposition on a workpiece such as a semiconductor wafer. A vacuum chamber 100 is enclosed by a cylindrical side wall 102, a ceiling 104 and a floor 106. A workpiece support pedestal 108 within the chamber 100 is held on a lift assembly 110 within the chamber 100 and has a workpiece support surface 108a facing the ceiling 104. A workpiece such as a semiconductor wafer 112 may be held on the support surface 108a. A sputter target 114 is held at the interior surface of the ceiling 104 and has a main surface 114a facing the support surface 108a of the pedestal 108. A process region 116 is defined between the support surface 108a and the target main surface 114a. An annular ceramic spacer 118 surrounds a side edge 114b of the sputter target 114. An annular confinement skirt 120 surrounding the process region 116 extends axially from the ceramic spacer 118 to the top peripheral edge 108b of the support pedestal 108. Gas injection nozzles 122 extending through the sidewall 102 at spaced-apart locations are coupled to a hollow gas distribution ring 124. A process gas source 126 furnishes a process gas to the gas distribution ring 124 through a mass flow controller or valve 128. A vacuum pump 130 is coupled to the chamber 100 through a passage 132 through the floor 106. A vacuum control valve 133 controls the chamber pressure.

The wafer support pedestal 108 may include an internal electrode 134. If the pedestal 108 embodies an electrostatic chuck, then a controllable D.C. voltage source 135 may be connected to the pedestal internal electrode 134. In order to control ion energy at the surface of the wafer 112, a low frequency RF bias power generator 136 may be connected through an RF impedance match 137 to the electrode 134. In addition, an intermediate or high frequency RF bias power generator 138 may be connected through an impedance match 139 to the electrode 134.

An enclosure 140 overlying the ceiling 104 contains a magnetron assembly 142. The magnetron assembly 142 includes a magnet 144 supported on a radial arm 146 and an axial spindle 148 supporting the arm 146. The radial arm 146 has separately articulating arm sections 146a, 146b. A rotation actuator 150 rotates the spindle 148, causing the magnet 144 to perform an orbital rotational motion over the ceiling 104. The enclosure 140 includes an enclosure side wall 152 and an enclosure lid 154. The lid has a central circular opening 156 through which the spindle 148 extends between the radial arm 146 and the rotation actuator 150 external of the enclosure 140.

The problem of plasma fluctuations arises upon application of RF source power to the target 114 by coupling the source power to an off-axis point on the chamber ceiling 104 or an off-axis point on the housing lid 154 (as two possible examples). The RF power distribution is necessarily concentrated at the point of application, leading to an azimuthally non-uniform RF power distribution. As the magnet 144 passes through a point of rotation in alignment with the point of RF power application, power coupling to the plasma temporarily peaks, leading to the process fluctuations discussed earlier in this specification.

In order to avoid such an asymmetrical distribution of RF power, a symmetrical conductor concentric with the axis of symmetry is provided on top of the housing 140, for application of RF and DC power to the target 114. Specifically, a conductive hollow cylinder 158 surrounding the spindle 148 extends from the edge of the circular opening 156 away from the enclosure 140. An RF connection rod 160 extends radially outwardly from the hollow cylinder 158. An RF impedance match 162 is coupled to the outer end of the RF connection rod 160. An RF power generator 164 is coupled to the RF impedance match 162. A DC connection rod 166 extends radially outwardly from the hollow cylinder 158 in a direction opposite to that of the RF connection rod 160. A DC power source 168 is coupled to the outer end of the DC connection rod 166. The DC connection rod 166 may be connected to an RF blocking filter 169 of the DC power supply 168.

The hollow cylinder 158, the connection rods 160, 166, the enclosure 140 and the ceiling 104 are formed of a non-magnetic conductive material, such as aluminum for example. The connection rods 160, 166 and the cylinder 158 may be formed of copper, to provide a highly conductive current path. RF current from the generator 164 flows in a circular manner around the hollow cylinder 158 for uniform distribution around the circumference of the enclosure 140 and uniform application to the target 114. DC current from the DC source 168 flows in a circular manner around the hollow cylinder 158 for uniform distribution around the circumference of the enclosure 140 and uniform application to the target 114. The target 114 is typically a metallic species that is to be deposited onto the workpiece 112.

Figure 3:
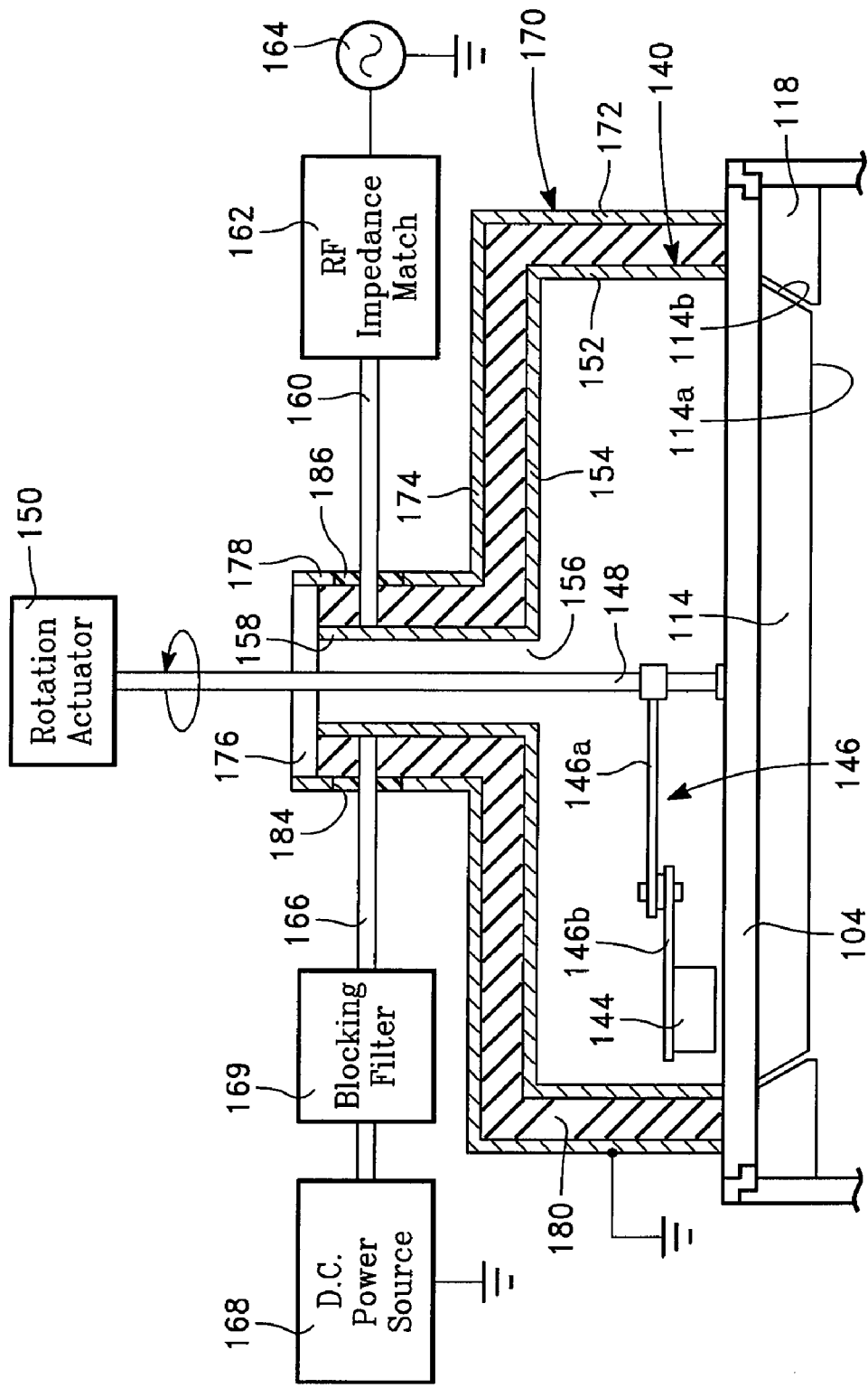
FIG. 3 is an enlarged detailed view of one embodiment of the upper housing in the reactor of FIG. 1.
Figure 4:
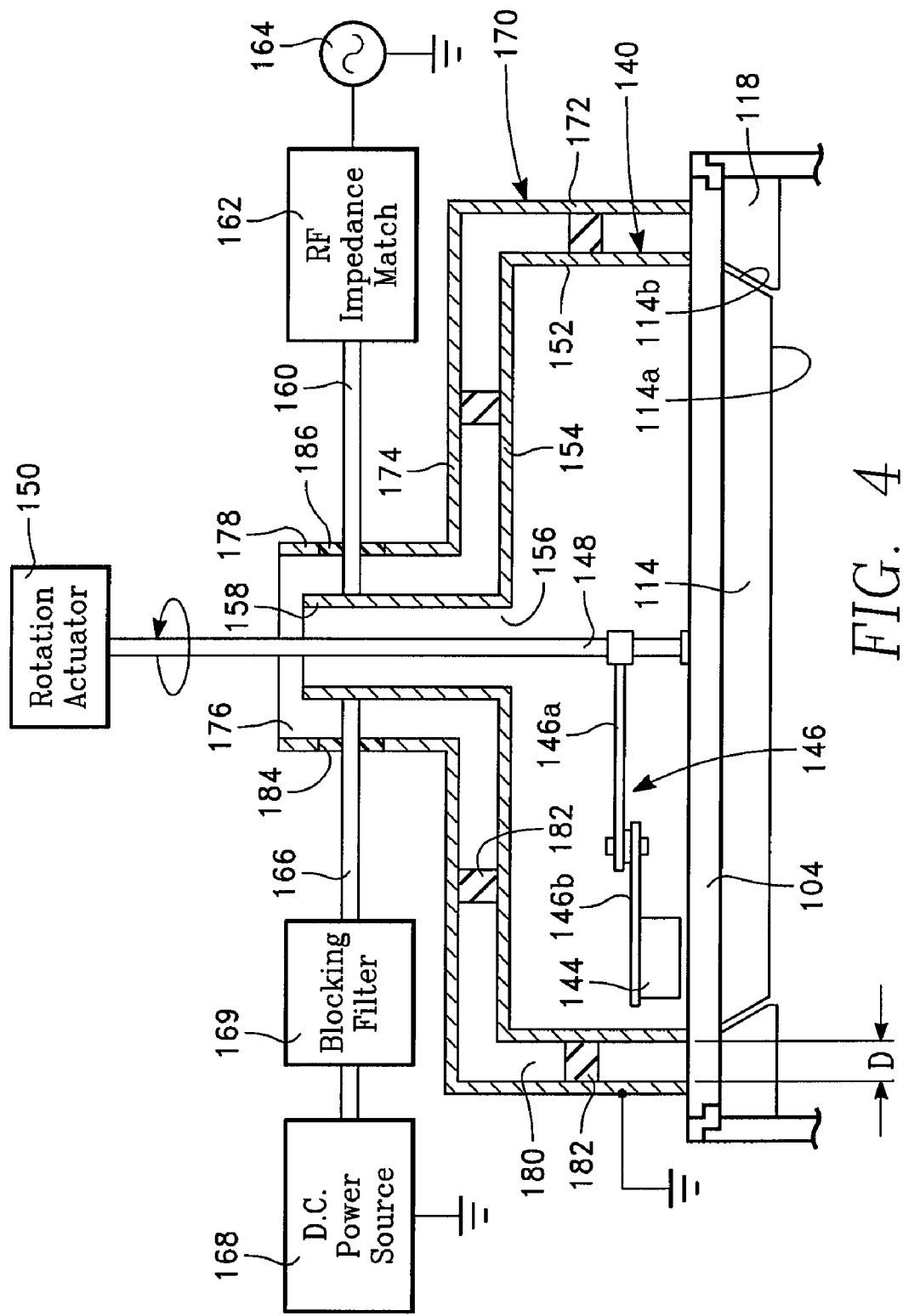
FIG. 4 is an enlarged detailed view of another embodiment of the upper housing in the reactor of FIG. 1.

FIG. 3 is an enlarged view of the aluminum enclosure 140. The enclosure 140 is surrounded by a grounded RF shield 170 conformal in shape with the enclosure 140. The grounded shield 170 includes a cylindrical side wall 172 and an annular top 174 having a circular passage 176 through which the cylinder 158 extends. The grounded shield further includes a cylindrical sheath 178 that is coaxial with the hollow cylinder 158. The grounded shield 170 may be formed of a non-magnetic metal such as aluminum or copper, for example. The shield 170 and the enclosure 140 are separated by an insulating space 180. The space 180 in one embodiment is filled with a dielectric material having a low dielectric constant. One example of a suitable material is plastic, such as G-10 plastic. FIG. 4 depicts an embodiment in which the space 180 is primarily filled with air, and is maintained by a number of small spacers 182. The spacers 182 may be formed of a dielectric material such as G-10 plastic. Parasitic capacitance is minimized by minimizing the dielectric constant of the space 180. For example, the spacers 182 may occupy a very small percentage of the volume of the space 180, the remainder of the space 180 being filled with a substance of minimum dielectric constant, such as air. Parasitic capacitance is further minimized by increasing the gap distance D across the space 180. In one embodiment, the connections rods 160, 166 may pass through respective openings 184 in the cylindrical sheath 178 of the grounded shield 170. Annular insulator rings 186 may be inserted in the openings 184 to provide insulation between each rod 160, 166 and the edge of each respective opening 184.

The gap distance D of the space 180 is sufficiently large so that the electric field across the gap does not exceed the breakdown threshold of the dielectric material (e.g., air or plastic) of the space 180. For example, there may be a voltage difference of 1100 to 1200 volts across the gap D of the insulating space 180. This may occur if the RF generator 164 imposes an average RF voltage of about 500 volts on the housing 140, the DC source 168 imposes a DC voltage of about 500 volts on the housing 140 and the RF bias power return through the housing 140 may impose an addition 100 volts. In this case, if the space 180 is filled with air (breakdown threshold of 33,000 volts/cm) then the required gap distance D would be a minimum of about 0.3 mm.

Figure 8:
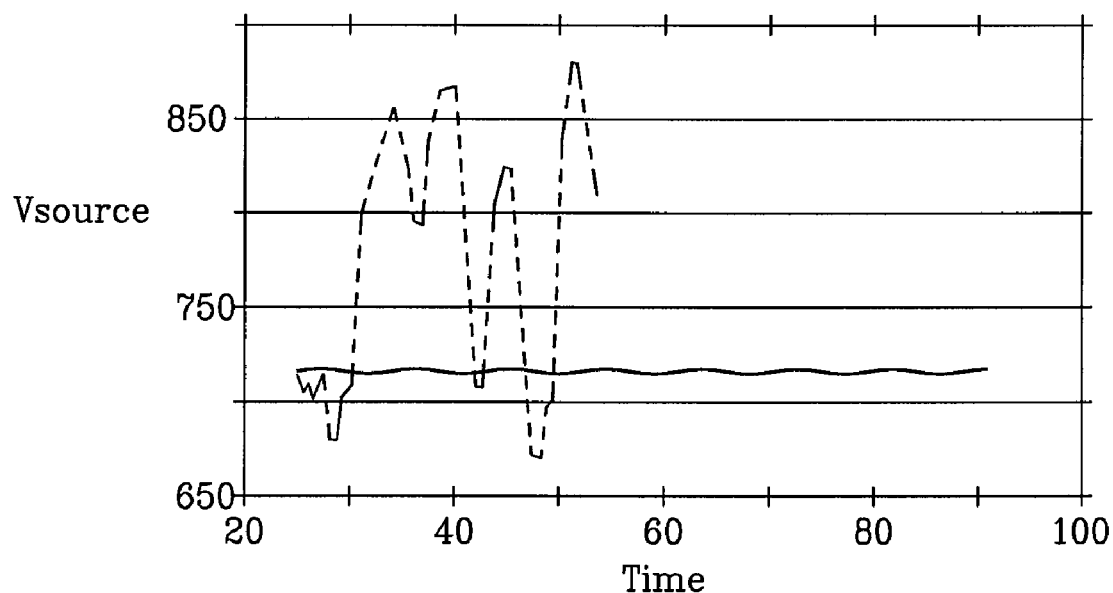
FIG. 8 is a graph of comparative test data of voltage fluctuations at the source power generator.

FIG. 5 is a simplified diagram depicting the axial flow of RF and DC currents from the RF and DC conductor rods 160, 166, down the cylinder 158 and across the ceiling 154, down the side wall 152 and through the ceiling 104 to the target 114. FIG. 6 is one plan view corresponding to FIG. 5 depicting the circular flow of DC current around the hollow cylinder 158 and radial DC current flow on the housing lid 154. FIG. 7 is another plan view corresponding to FIG. 5 depicting the circular flow of RF current around the hollow cylinder 158 and radial RF current flow on the housing lid. Circular current flow around the hollow cylinder 158 facilitates transformation of the current distribution to a circularly symmetrical (and uniform) distribution. This virtually eliminates plasma fluctuations due to rotation of the magnet 144. This result is confirmed by comparative test data represented by the graph of FIG. 8. The vertical axis of the graph of FIG. 8 corresponds to an RF voltage measured at the output of the VHF target source power generator (e.g., the generator 164 in the embodiment of FIG. 1), while the horizontal axis corresponds to time. The dashed line curve represents data obtained in a reactor in which the RF power is applied to an off-axis connection point on the lid 154 of the housing 140. The deviation between minimum and maximum RF voltages for the dashed-line curve is over 26%. The solid line curve represents data obtained in the on-axis RF feed of the reactor of FIG. 1, in which the minimum-maximum RF voltage deviation is dramatically reduced to 0.7%. This corresponds to a highly stable or quiescent behavior leading to the following improvements: (1) the RF generator and impedance match maintain stable operation over a much wider range of chamber pressures, extending above the desired high-pressure regime on the order of 100 mT; (2) plasma is not periodically stimulated to penetrate below the wafer support pedestal; (3) breakdown or arcing is eliminated or reduced; (4) the reduced fluctuations in source power voltage increase efficiency; (5) the DC power level can be minimized without false alarming of the DC power arcing protection circuits; (6) the wafer-target gap may be reduced (e.g., to 5 cm) without causing azimuthal non-uniformities in deposition thickness distribution on the wafer.

Figure 9:
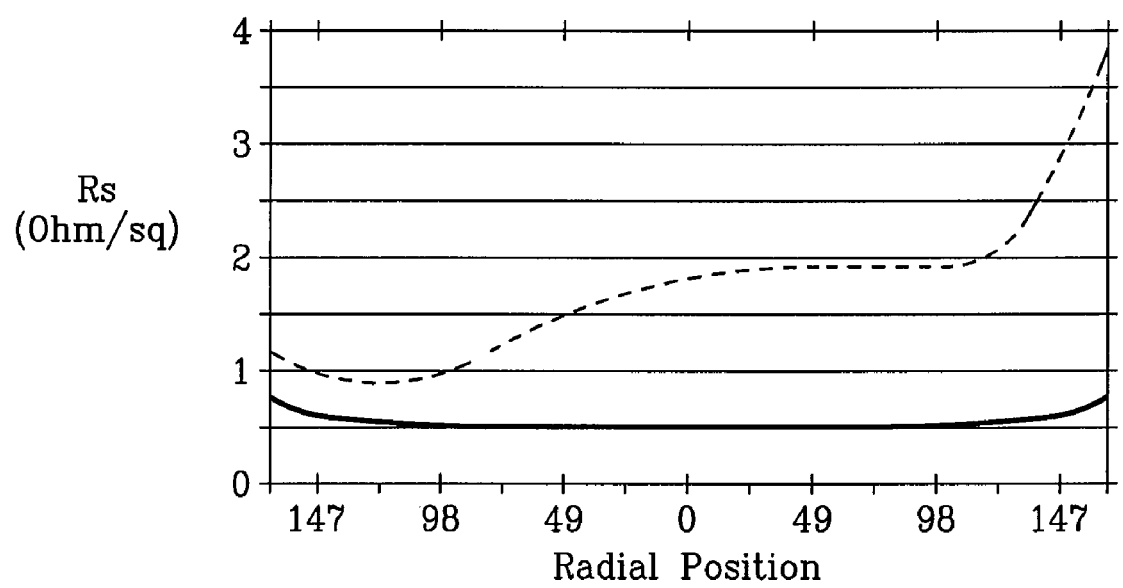
FIG. 9 is a graph of comparative test data of corresponding to deposited film thickness distribution.

This last result, elimination of azimuthal non-uniformities on the wafer, is confirmed by comparative test data represented in the graph of FIG. 9. The vertical axis of FIG. 9 corresponds to sheet resistance, which is an indicator of deposition thickness, while the horizontal axis corresponds to radial position on the wafer taken along a selected radial line. The dashed line curve of FIG. 9 represents data obtained with a conventional off-axis RF feed to the target mentioned earlier in this specification. The azimuthal non-uniformity represented by the dashed-line curve corresponds to a minimum-to-maximum deviation of 25%. The solid line curve of FIG. 9 represents data obtained with the on-axis RF feed of the reactor of FIG. 1, in which the minimum-to-maximum azimuthal deviation has been reduced to 5%. The asymmetry of the dashed line curve is apparent in FIG. 9, the dashed line curve having a clear upward bias from left to right. The symmetry of the solid line curve is apparent, indicating the azimuthal uniformity achieved by the reactor of FIG. 1.

While the foregoing is directed to embodiments of the present invention, other and further embodiments of the invention may be devised without departing from the basic scope thereof, and the scope thereof is determined by the claims that follow.

What is claimed is:
1. A plasma reactor comprising:
  a reactor chamber comprising a ceiling, a sputter target adjacent said ceiling and a wafer support pedestal within the chamber facing said sputter target;
  a conductive housing overlying said ceiling and having a top lid facing said coiling;
  a rotating magnet assembly contained within said housing and comprising a rotatable spindle, a radial arm assembly coupled at, an inner end to said spindle, and a magnet coupled to an outer end of said radial arm assembly, said top lid of said housing comprising a central port, said spindle extending axially through said central port;
  a conductive hollow cylinder on said top lid and surrounding a portion of said spindle that extends above said top lid;
  a radial RF connection rod having a first radially inward end connected to said hollow cylinder and a first radially outward end, said radial RF connection rod extending radially outwardly from said hollow cylinder to said first radially outward end;
  an RF power source comprising an RF generator and an RF impedance match, said impedance match being connected to said first radially outward end of said radial RF connection rod; and
  a grounded conductive shield enclosure outside of and surrounding said conductive housing and said conductive hollow cylinder, said radial RF connection rod penetrating and insulated from said grounded conductive shield enclosure.

2. The reactor of claim 1 further comprising:
  a radial DC connection rod having a second radially inward end connected to said hollow cylinder and a second radially outward end, said radial DC connection rod extending radially outwardly from said hollow cylinder to said second radially outward end of said radial DC connection rod;
  a DC power source comprising a DC power supply and an RF blocking filter, said RF blocking filter being connected to said second radially outward end of said radial DC connection rod, said radial DC connection rod penetrating and insulated from said grounded conductive shield enclosure.

3. The reactor of claim 2 wherein said radial RF connection rod and said radial DC connection rod emanate from locations on said hollow cylinder that are angularly offset from one another.

4. The reactor of claim 3 wherein said locations are offset by about 180°.

5. The reactor of claim 2 wherein said connection rods, said hollow cylinder, said top lid, said housing and said ceiling are conductive and provide an electrical path to said sputter target.

6. The reactor of claim 1 further comprising:
  an electrode within said wafer support pedestal;
  an RF bias power source coupled to said wafer support pedestal.

7. The reactor of claim 6 wherein said RF bias power source comprises:
  a high frequency RE power generator and a high frequency impedance match connected to said electrode;
  a low frequency RF power generator and a low frequency impedance match connected to said electrode.

8. The reactor of claim 1 wherein said grounded conductive shield enclosure comprises:
  a conductive side wall surrounding said housing and separated therefrom to form a first gap therebetween;
  a conductive shield lid overlying said top lid of said housing and separated therefrom by a second gap and separated therefrom to form a second gap therebetween; and
  a conductive sleeve surrounding said hollow cylinder and separated therefrom to form a third gap therebetween, said first, second and third gaps forming a continuous space.

9. The reactor of claim 8 wherein said continuous space is filled with a dielectric substance.

10. The reactor of claim 9 wherein said dielectric substance comprises air, said reactor further comprising insulator struts in said space for maintaining said gaps.

11. In plasma reactor having a ceiling and a sputter target adjacent said ceiling, an RF feed system comprising:
  a conductive housing overlying said ceiling and having a top lid facing said ceiling;
  a rotating magnet assembly contained within said housing and comprising a rotatable spindle, a radial arm assembly coupled at an inner end to said spindle, and a magnet coupled to an outer end of said radial arm assembly, said top lid of said housing comprising a central port, said spindle extending axially through said central port;
  a conductive hollow cylinder on said top lid and surrounding a portion of said spindle that extends above said top lid;

a radial RF connection rod having a first radially inward end connected to said hollow cylinder and a first radially outward end, said radial connection rod extending radially outwardly from said hollow cylinder to said first radially outward end, said radial RF connection rod being adapted for connection to an RF power source; and a grounded conductive shield enclosure outside of and surrounding said conductive housing and said conductive hollow cylinder, said radial RF connection rod penetrating and insulated from said grounded conductive shield enclosure.

12. The apparatus of claim 11 further comprising:

a radial DC connection rod having a second radially inward end connected to said hollow cylinder and a second radially outward end, said radial DC connection rod extending radially outwardly from said hollow cylinder to said second radially outward end of said radial DC connection rod, said radial DC connection rod penetrating and insulated from said grounded conductive shield enclosure, said radial DC connection rod being adapted for connection to a DC power source.

13. The apparatus of claim 12 wherein said radial RF connection rod and said radial DC connection rod emanate from locations on said hollow cylinder that are angularly offset from one another.

14. The apparatus of claim 13 wherein said locations are offset by about 180°.

15. The apparatus of claim 12 wherein said connection rods, said hollow cylinder, said top lid, said housing and said ceiling are conductive and provide an electrical path to said sputter target.

16. The apparatus of claim 11 wherein said grounded conductive shield enclosure comprises:

a conductive side wall surrounding said housing and separated therefrom to form a first gap therebetween;

a conductive shield lid overlying said top lid of said housing and separated therefrom by a second gap and separated therefrom to form a second gap therebetween; and a conductive sleeve surrounding said hollow cylinder and separated therefrom to form a third gap therebetween, said first, second and third gaps forming a continuous space.

17. The apparatus of claim 16 wherein said continuous space is filled with a dielectric substance.

18. The apparatus of claim 17 wherein said dielectric substance comprises air, said apparatus further comprising low dielectric constant insulator struts in said space for maintaining said gaps.

* * * * *